United States Patent [19]

Igisu

[11] 4,026,010

[45] May 31, 1977

[54] METHOD FOR REMOVING THE STRAIN OF A SUBSTRATE FOR AN ELEMENT OF INTEGRATED CIRCUIT

[76] Inventor: Taro Igisu, No. 9, 12-Ban, 1-Chome, Jiyugaoka, Munakatacho, Munakatagun, Fukuoka, Japan

[22] Filed: June 21, 1976

[21] Appl. No.: 697,773

[52] U.S. Cl. .................................. 29/625; 148/1.5; 148/12.9

[51] Int. Cl.² .................. C21D 1/04; H05K 13/00

[58] Field of Search ...................... 29/625, DIG. 46; 148/12.9, 1.5; 72/DIG. 20; 264/340

[56] References Cited

UNITED STATES PATENTS 4,001,053   1/1977   Igisu .................................. 148/12.9

*Primary Examiner*—Arthur J. Steiner

[57] ABSTRACT

A method for removing the strain of a substrate for an element of integrated circuit, which comprises mounting the substrate on a vibrating plate in such a manner as to be movably supported with the aid of rubber string, forcedly vibrating the vibrating plate, whereby the substrate undergoes sympathetic vibrations which cause the substrate to be stress relieved.

3 Claims, 4 Drawing Figures

METHOD FOR REMOVING THE STRAIN OF A SUBSTRATE FOR AN ELEMENT OF INTEGRATED CIRCUIT

The present invention relates to a method for removing the strain, and more particularly to a method for reducing and making uniform the non-uniform and high residual internal stress produced in a substrate for an element of integrated circuit.

In general, when a substrate itself for an integrated circuit is produced, and when it is subjected to heat treatment, evaporation, cutting and soldering in the fabrication process of circuit and in other machining processes, an internal residual stress is highly and non-uniformly set up in the substrate. In most cases, moreover, the substrate will be stress relieved with time and temperature, and this stress relief phenomenon will give rise to inconvenience and various kinds of troubles corresponding to the stress relieved area of the substrate. As for nominal resistance value per unit area obtained from a thick film integrated circuit fabricated by printing the circuit onto the substrate and baking the same for curing, for example, the error of the nominal resistance value per unit area will increase by 0.4 – 0.5% if the circuit is permitted to stand for about one year at normal temperature, although its permissible error is of about 0.1%. As a well-known countermeasure against such a phenomenon, heat treatment for annealing for 1,000 hours at 125° C is usually performed in a plant. As a matter of fact, heat treatment is an only method that has been applied up to now to thick film integrated circuits for the purpose of stress relief.

The inventor priorly invented a method for relieving the residual stresses in metals such as sintered alloys, carbon steels, steels, and stainless steels and in ceramics, described in U.S. Pat. No. 4,001,053, in which method a work formed of metal or ceramic is movably mounted on a vibrator, forcedly vibrated at a frequency below the natural frequency thereof, and then released from said vibrator, thereby affording said work to be subject to free vibration. As a result of repeatedly performing a large number of investigations and tests on the applicability of the prior invention to a variety of fields, the inventor has confirmed that the prior invention is effectively applicable to a substrate for an element of integrated circuit for the purpose of reducing or removing the residual stress therein. For this reason, the inventor has succeeded in making the present invention.

An object of the present invention, therefore, is to provide a method for removing those residual stresses in a substrate for an element of integrated circuit which have been built up in the steps of production of said substrate and/or in further processes thereafter, without applying the conventional method comprising annealing said substrate for thousands of hours, said method comprising mounting said substrate on a vibrating plate having natural frequency below that of said substrate in such a manner as to be movably supported thereby with the aid of elastic member such as synthetic rubber, natural rubber or the like, and vibrating said vibrating plate so as to effect percussion of said substrate, thereby permitting said substrate to be stress reduced or stress removed, which results in removal of the strain.

Another object of the present invention is to provide a method for stabilizing the nominal resistance value per unit area and the temperature coefficient of resistance of resistors formed on an element of integrated circuit.

There are three possible methods of effecting percussion of the substrate;

1. effecting percussion of the substrate after cutting the same into a predetermined size, but before fabricating the circuit thereon;
2. effecting percussion of the same after finishing fabricating the circuit thereon;
3. effecting percussion of the same after cutting so as to obtain uniformity of the stress and then effecting percussion again after finishing fabricating the circuit thereon.

According to the first method (1), in case of an element of a thick film integrated circuit in which the substrate comes under extremely high stress when printed circuit, the effect of the method of the present invention is inferior. In case of an element of thin film integrated circuit, however, it can be considered that the substrate is not affected very much by printing process.

When the second method (2) is applied, the percussion makes possible equalization of the residual stress in the substrate itself, and in addition, those stresses can be made uniform as well which have been produced locally in the substrate in the fabrication process of the circuit. In the case of the thick film integrated circuit, in particular, this method makes it possible to prevent a possible change of the residual stress caused by the lapse of time due to lack of consideration of the stress to be produced in the fabrication process of the circuit.

According to the third method (3), the printed circuit substrate as well as the substrate itself is given percussion under the most favorable conditions, thereby most properly performing the equalization of the residual stress.

The most suitable value of percussion condition can be derived from the theoretical formulas which were given in the prior application. Under conditions drawn from said formulas, the percussion of the substrate or the printed circuit substrate can be effected respectively by a method which is theoretically the same as that applied in the prior invention. It is desirable, however, that the substrate should be mounted on the vibrating plate with easiness and with care not to be disconnected from the vibrating plate, because the substrate to be stress relieved according to the present invention is of comparatively small size.

Various aspects of the present invention will be more apparent to persons skilled in the art from the following illustrative examples.

THE DRAWING

EXAMPLE 1

A substrate of a thick film integrated circuit

ADS-96F plate with the dimensions 51 × 51 × 0.6 (thickness) mm, manufactured by Corrs Company, was machined with an ordinary glass cutter to obtain a substrate with a length of 25 mm and a width of 16 mm.

Figure 1:
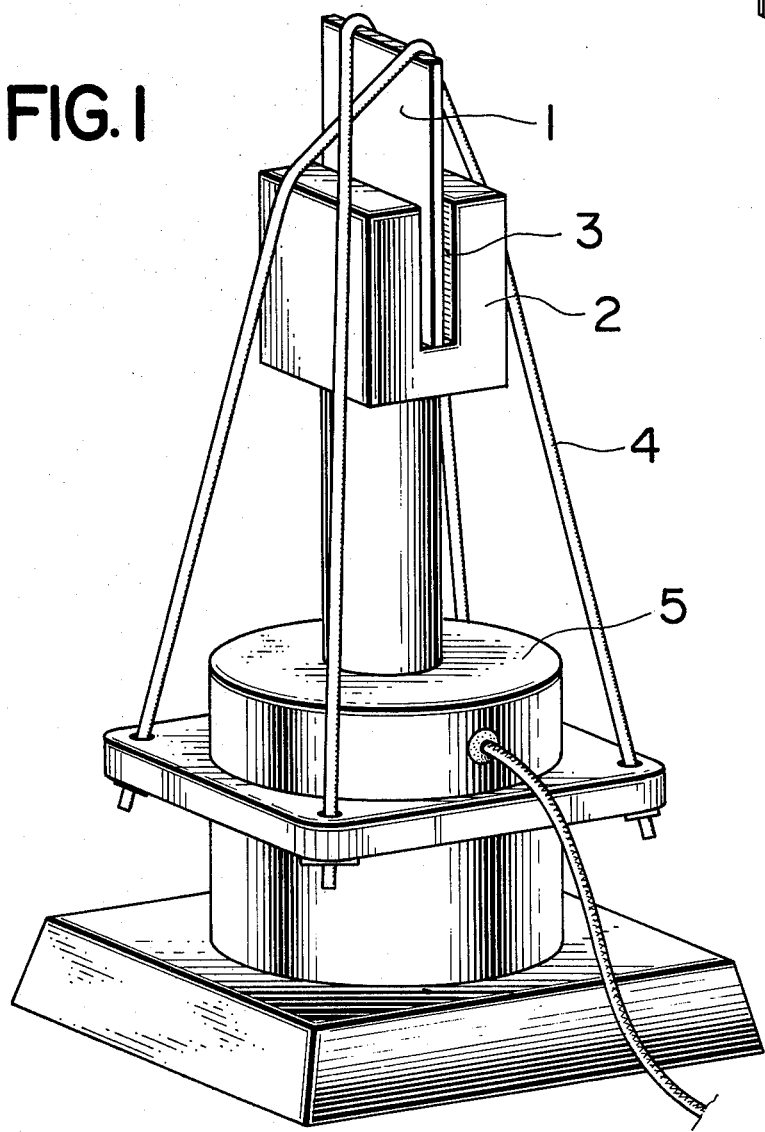
FIG. 1 is a perspective view of an embodiment of an apparatus for carrying out the present invention in which a substrate is held by a vibrating plate with its length vertically directioned.

The substrate 1 for a thick film integrated circuit was inserted in a groove provided on the surface of a vibrating plate 2, with its length vertically directioned, and was held therein with the aid of a rubber string 4 to the extent that it was restrained from falling or from sliding horizontally, as shown in FIG. 1. Then, a vibrator 5 (having the capacity 200 VA, the maximum vibrating force 50 G and the maximum frequency 20 KHz) was activated for 30 minutes so as to vibrate the vibrating plate 2 at the frequency of 30 Hz with the acceleration of 5 G. As a result of the vibration of the vibrating plate 2, the substrate 1 underwent sympathetic vibrations so as to cause a succession of impacts, which result in percussion, thereby permitting the substrate 1 to be free from the strain.

The residual surface stresses in the substrate 1 were measured and the results are shown in Table 1, in which the right side and the reverse side of the substrate are indicated by A and B, respectively.

Table 1

| measured | surface A crosswise | surface A lengthwise | kg/mm² surface B crosswise | surface B lengthwise |
|---|---|---|---|---|
| before percussion | +4.6 | +6.9 | −0.7 | −6.9 |
| after percussion | −3.6 | +6.9 | −1.4 | +7.1 |

In Table 1, "crosswise" values are those of the residual stress measured along the width of the substrate, while "lengthwise" along the length of the same.

From the result of this measurement, it is understood that the surface A of the substrate for the thick film integrated circuit shows tensile stress along the length and width thereof before the strain removal treatment, while the surface B shows compressive stress. This is considered to be a peculiar phenomenon accompanied by the machining process. However, the two surfaces A, B, i.e., right and reverse sides of the substrate, have different effects on further processes such as circuit printing, due to a great difference of the residual stress therebetween.

In other words, the effect of the processes thereafter on the substrate depends on the surface to be used. On the other hand, it has been found out that after the treatment both of the surfaces A, B show the comparatively uniform residual stresses having common directional qualities. This means the difference between the two surfaces A, B is reduced.

EXAMPLE 2

A thick film integrated circuit

Figure 3:
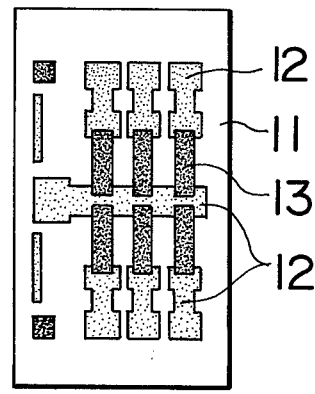
FIG. 3 is a plan view of the substrate onto which the circuit is fabricated.

A substrate 11 of the dimensions 25 × 16 × 0.6 mm was made from ADS-96F plate of Corrs Company. As Pd-Ag conductive paste, Glaze Alloy for IC made by Tamura Kaken Co., Ltd. was applied onto the substrate and cured by baking so as to provide terminal electrodes 12, as shown in FIG. 3, whereupon the surface roughness of the terminal electrodes 12 was adjusted to mean roughness value ± 0.1 μm on center line thereof. Then, two kinds of resistive carbon pastes were applied onto the substrate to supply resistors 12 with a length of 6 mm and a width of 2 mm, and thereby said resistors 13 had the nominal resistance values per unit area of 1 KΩ and 100 KΩ. The thickness of the resistors 13 was adjusted to 20 ± 2 μm. After applying the resistive pastes, the substrate was kept in horizontal position at room temperature for about 15 minutes, and levelling was performed so that the film thus obtained may have a flat surface. Then, the substrate was dried in an air at 100° C for about 30 minutes and further baked for curing at 760° C ± 2° C for about 10 minutes in an atmosphere consisting of oxygen of 20 volume % and nitrogen of 80 volume %.

Figure 2:
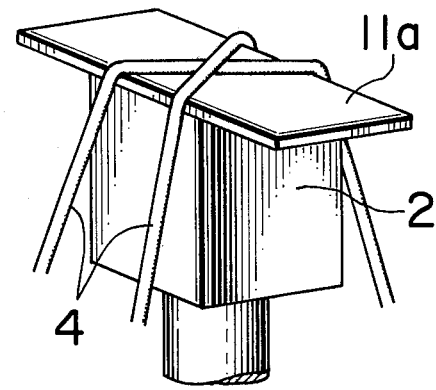
FIG. 2 is a view similar to FIG. 1, but shows only a part of the apparatus of FIG. 1, the substrate being held by the vibrating plate with its surface for the circuit disposed horizontally.
Figure 4:
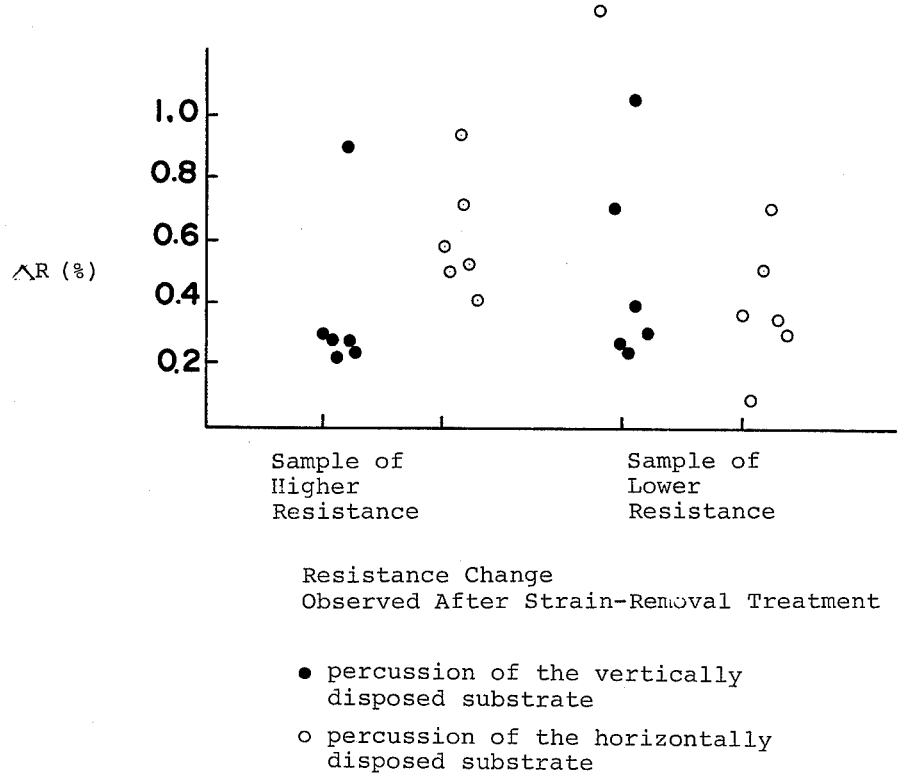
FIG. 4 is a graph showing a change of the resistance value per unit area caused by the percussion of the substrate.

The sample thus obtained was subjected to strain removal treatment in a manner similar to the case of Example 1, as shown in FIG. 1 (percussion of the vertically disposed substrate). Another similar sample was movably mounted on the vibrating plate 2 with its printing surface 11a turned away from the plate 2, restrained from sliding by means of a rubber string, as shown in FIG. 2, and subjected to strain removal treatment for 30 minutes at the frequency of 30 Hz with the acceleration of 7 G (percussion of the horizontally disposed substrate). After the strain removal treatment, the resistance values per unit area of 1 and 100 KΩ and the temperature coefficient of resistance were measured. A change of the resistance values is shown in FIG. 4, and a change of the temperature coefficient of resistance in Table 2.

Table 2

| used paste | before percussion (PPM/° C) | after percussion (PPM/° C) | |
|---|---|---|---|
| lower resistive paste (1 KΩ) | +54 | percussion of the vertically disposed substrate | +49 |
| | | percussion of the horizontally disposed substrate | +52 |
| higher resistive paste (100 KΩ) | +2,336 | percussion of the vertically disposed substrate | −279 |
| | | percussion of the horizontally disposed substrate | −292 |

From these results, it has been found out that the residual stress in the conductive portion of the thick film integrated circuit is relieved and made uniform after the treatment. Furthermore, the surface resistance value of the resistors has been increased by 0.4 − 0.5% as shown in FIG. 4 to show substantially the same result with that of the case in which heat treatment for annealing is carried out at 125° C for 1,000 hours. Referring to FIG. 4, in which the horizontal coordinate axis represents the standard resistance (100 KΩ as the higher resistance, and 1 KΩ as the lower resistance) while the vertical coordinate axis represents the increment ΔR of resistances above said standards, the values with respect to the percussion of the vertically disposed substrate and the percussion of the horizontally disposed substrate respectively are staggeredly plotted for the purpose of clearer illustration. As a matter of fact, the closer to zero, the more the temperature coefficient of resistance is ideal. By the treatment according to the present invention, that of the resistive paste of 1 KΩ has scarcely changed to +50 PPM/° C, but that of the higher resistive paste of 100 KΩ has been remarkably decreased to about 1/10. It has not been clarified theoretically yet why the temperature coefficient of the resistance shifts from positive to negative.

The above description of the examples is given with reference to the substrate for the thick film integrated circuit and to the printed integrated circuit element. It is natural, however, that similar results can also be obtained with respect to an element of a thin film integrated circuit.

What is claimed is:

1. In the method of fabricating an integrated circuit on a substrate by printing the circuit onto the substrate and curing, the improvement comprising removing the residual stresses of said substrate by mounting said substrate on a vibrating plate having a natural frequency below that of said substrate in such a manner as to be movably supported thereby with the aid of an elastic member and forcedly vibrating said substrate at a frequency below the natural frequency of said substrate, whereby said substrate is subjected to percussion.

2. The method as claimed in claim 1, in which said substrate is subjected to percussion after the circuit has been fabricated thereon.

3. The method as claimed in claim 1, in which said substrate is first subjected to percussion so as to make the stress uniform, then has the circuit fabricated thereon, and thereafter is again subjected to percussion.

* * * * *